United States Patent
Benner et al.

(10) Patent No.: US 7,994,434 B2
(45) Date of Patent: Aug. 9, 2011

(54) ELECTROMAGNETIC INTERFERENCE SHIELDING APPARATUS AND METHOD

(75) Inventors: Alan F. Benner, Poughkeepsie, NY (US); Casimer M. DeCusatis, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 12/388,556

(22) Filed: Feb. 19, 2009

(65) Prior Publication Data

US 2010/0206627 A1    Aug. 19, 2010

(51) Int. Cl.
*H01R 13/648*    (2006.01)
*H05K 9/00*    (2006.01)

(52) U.S. Cl. .................... 174/360; 174/387; 174/51

(58) Field of Classification Search ............ 174/360, 174/387, 51; 361/816
See application file for complete search history.

(56) References Cited

U.S. PATENT DOCUMENTS

| | | | |
|---|---|---|---|
| 3,830,954 A * | 8/1974 | Caudill | 174/362 |
| 4,498,715 A | 2/1985 | Peppler | |
| 4,749,895 A * | 6/1988 | Ruelle | 310/113 |
| 5,216,579 A | 6/1993 | Basara et al. | |
| 5,388,995 A | 2/1995 | Rudy, Jr. et al. | |
| 5,479,321 A | 12/1995 | Mair et al. | |
| 5,604,668 A * | 2/1997 | Wohrstein et al. | 361/816 |
| 5,770,898 A * | 6/1998 | Hannigan et al. | 307/147 |
| 5,880,403 A * | 3/1999 | Czajkowski et al. | 174/387 |
| 5,936,198 A | 8/1999 | Rentmore | |
| 6,016,083 A * | 1/2000 | Satoh | 333/12 |
| 6,016,252 A | 1/2000 | Pignolet et al. | |
| 6,162,989 A * | 12/2000 | Garner | 174/358 |
| 6,538,903 B1 * | 3/2003 | Radu et al. | 361/818 |
| 6,627,811 B2 | 9/2003 | Rubenstein et al. | |
| 6,667,436 B2 * | 12/2003 | Takami et al. | 174/387 |
| 6,953,889 B2 | 10/2005 | Hanks | |
| 7,154,050 B2 * | 12/2006 | Sekijima et al. | 174/369 |
| 7,177,161 B2 * | 2/2007 | Shima | 361/816 |
| 2003/0111243 A1 * | 6/2003 | Lindberg et al. | 174/35 R |
| 2004/0118582 A1 * | 6/2004 | Deguchi | 174/35 GC |

FOREIGN PATENT DOCUMENTS

EP    0668714 A1    8/1995

* cited by examiner

*Primary Examiner* — Hung V Ngo
(74) *Attorney, Agent, or Firm* — Cantor Colburn LLP; Steven Chiu

(57) ABSTRACT

A shielding apparatus has first and second electrically conductive sheets attached to an interior of a housing. A gap between the first and second electrically conductive sheets has a size based on a predefined desired cutoff frequency, and the widths of the first and second electrically conductive sheets are no more than twice the size of the gap. The lengths of the first and second electrically conductive sheets are at least four times the size of the gap.

17 Claims, 11 Drawing Sheets

ELECTROMAGNETIC INTERFERENCE SHIELDING APPARATUS AND METHOD

This invention was made with Government support under HR0011-07-9-0002 awarded by the Defense Advanced Research Projects Agency (DARPA). The Government has certain rights to this invention.

BACKGROUND

The present invention relates to electromagnetic shielding of electronic equipment, and more specifically, to electromagnetic compatibility (EMC) shielding in a chassis or other package housing electronic equipment.

Blade and rack-mounted servers are popular form factors for data center servers. These types of server have been used, for example, in data farms and in high performance supercomputers. In order to achieve high performance, many rack-mounted servers are clustered and connected using fiber optic interconnects. This can result in hundreds or even thousands of individual optical fibers emerging from a single server package. Adjusting traditional server I/O designs providing a rack or cabinet with a door to access optical interconnects could be problematic because such designs do not scale well to the number of fibers required and because the resulting large size of the cabinets produces excessive exposure to both coupled and conducted electromagnetic noise.

SUMMARY

A shielding apparatus according to an embodiment as disclosed herein has first and second electrically conductive sheets attached to an interior of a housing in spaced apart, substantially parallel relationship, both the first and second electrically conductive sheets being in electrical communication with a ground. A gap lies between the first and second electrically conductive sheets, and the width of each of the first and second electrically conductive sheets is no more than twice the size of the gap. The length of the first and second electrically conductive sheets is at least four times the size of the gap, the gap and first and second electrically conductive sheets thereby being sized to prevent propagation of electromagnetic radiation above a predefined wavelength.

According to another embodiment of the shielding apparatus as disclosed herein, a shielding apparatus has a first electrically conductive sheet configured to be attached to a housing, the housing containing an object to be shielded and in electrical communication with a ground. A second electrically conductive sheet is also configured to be connected to the housing, the second sheet being substantially parallel to the first electrically conductive sheet. At least one of the first and second electrically conductive sheets is connected to a ground. A gap between the first and second electrically conductive sheets is sized to accommodate cables passing into the housing and connected to the object to be shielded. A first hole is sized to accommodate cables passing into the housing and connected to the object to be shielded, the first hole being formed in one of the first electrically conductive sheet, the second electrically conductive sheet, a side wall of the shielding apparatus, and an end wall of the shielding apparatus. A second hole similar to the first hole is size is formed in one of the first electrically conductive sheet, the second electrically conductive sheet, a side wall of the shielding apparatus, and an end wall of the shielding apparatus. The size of the gap is based on a predetermined frequency of radiation to be blocked by the shielding apparatus, the first and second electrically conductive sheets having a width that is no more than twice the size of the gap and having a length that is at least four times the size of the gap.

Further, an embodiment of a method of electromagnetic shielding disclosed herein includes forming a first hole in one of a first electrically conductive sheet, a second electrically conductive sheet, a side wall of a shielding apparatus, and an end wall of the shielding apparatus, and forming a second hole in one of the first electrically conductive sheet, the second electrically conductive sheet, a side wall of a shielding apparatus, and an end wall of the shielding apparatus, the second hole being of substantially identical dimension to the first electrically conductive sheet. The method also includes orienting the first and second electrically conductive sheets in substantially parallel relationship separated by a gap of a size based on a predetermined cutoff frequency of radiation to be blocked and such that the first and second electrically conductive sheets have a width that is no more than twice the size of the gap.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Figure 1:
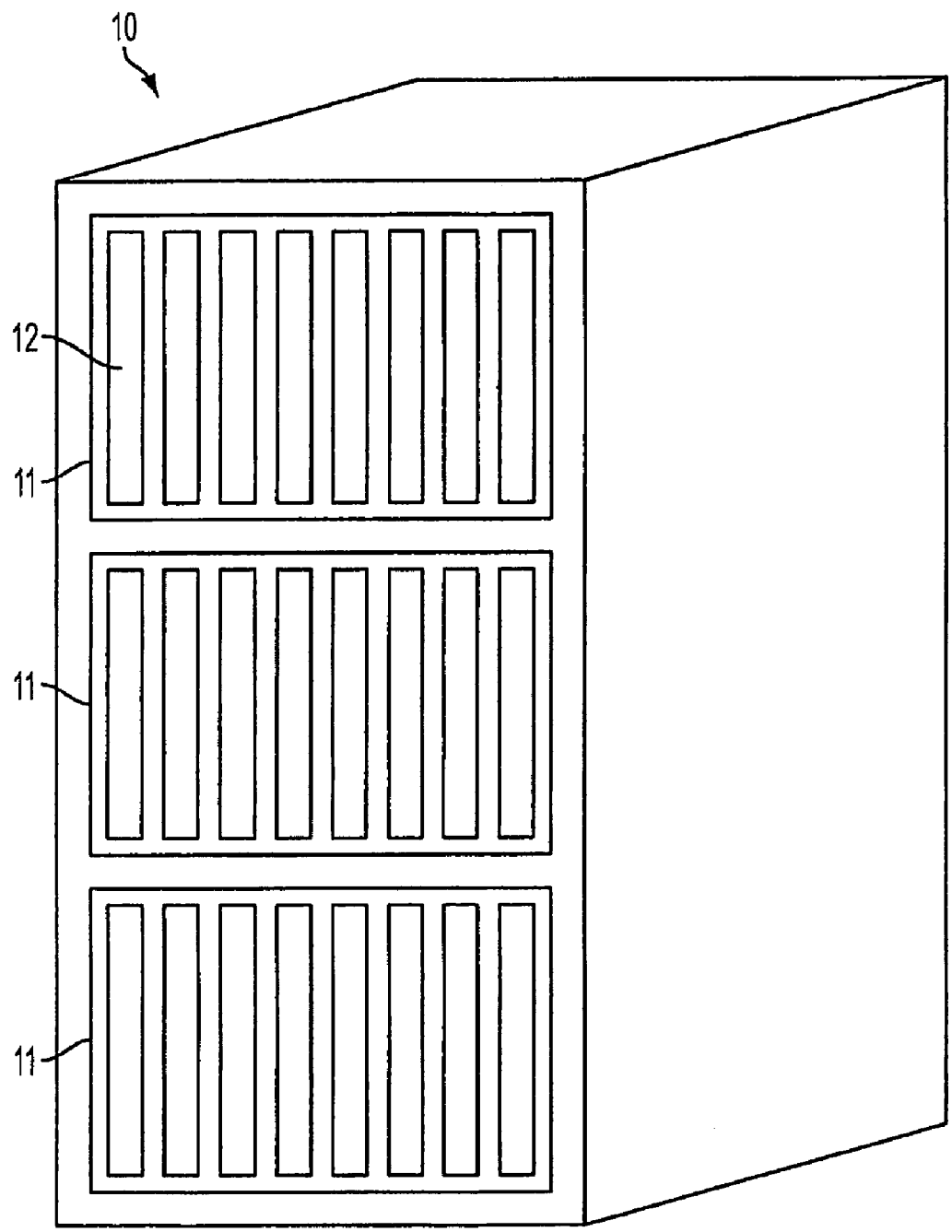
FIG. 1 is a schematic isometric view of server rack including an electronic equipment housing in which embodiments can be employed.
Figure 2:
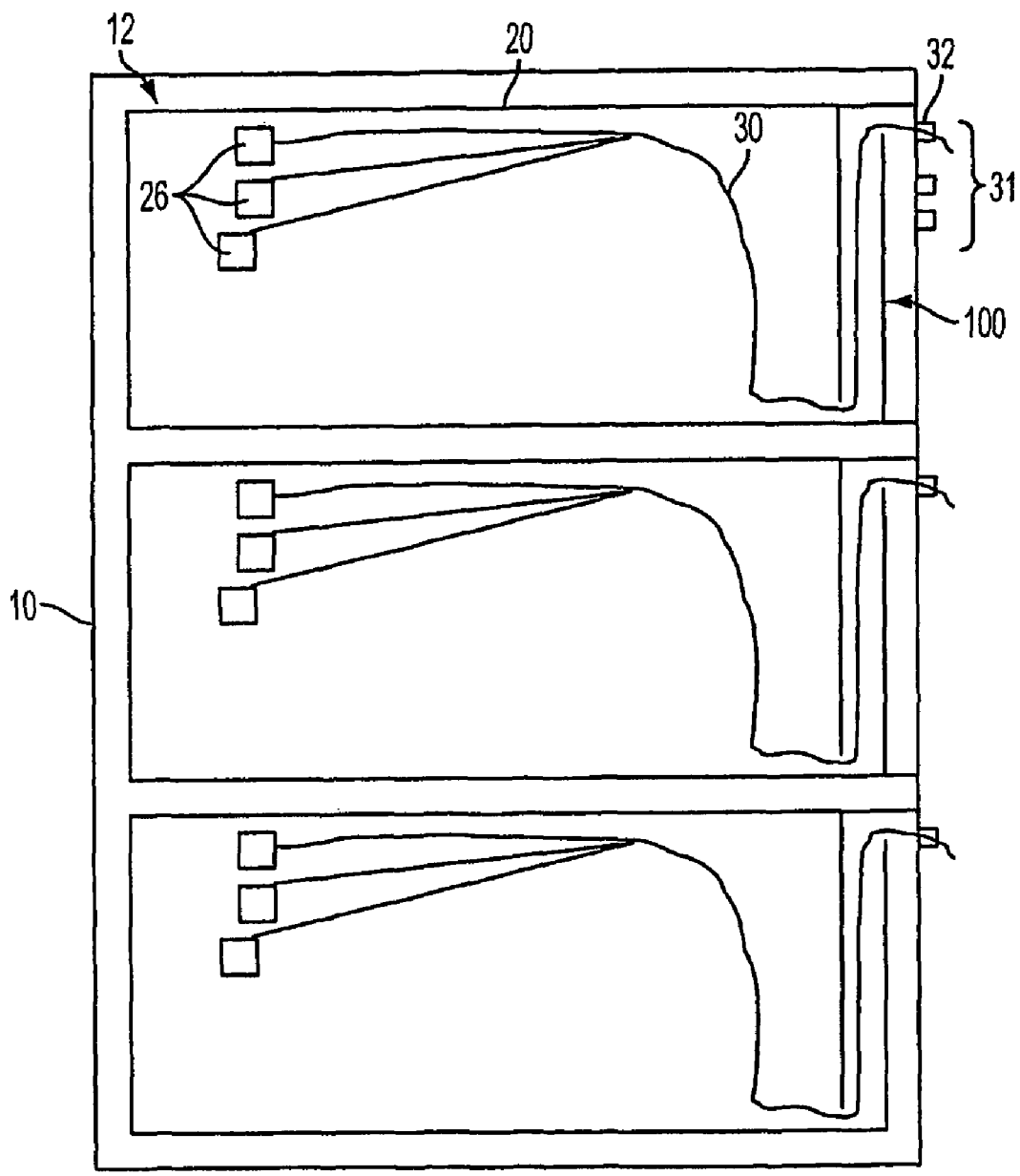
FIG. 2 is a schematic side view of a server rack including an electronic equipment housing in which a shielding apparatus according to an embodiment is employed.

FIG. 1 illustrates an example of a server rack 10 including one or more blade server chassis 11, each of which can house one or more blade servers 12. As seen in FIG. 2, a blade server 12 can include a housing 20 through which cables 30 must pass to data communications ports 31, such as an optical connector 32. While in this case the housing is that of a blade server mounted in one of a plurality of blade server chassis in the rack, embodiments can be used with the blade server chassis being regarded as the housing and with the rack being regarded as the housing. To connect the equipment 26 transmitting and/or receiving the data to the data communication ports, at least one hole is formed in any shielding that may be present in the blade server package. To prevent electromagnetic radiation or EMC from entering or exiting the housing 20, a shielding apparatus 100 of an embodiment is employed between the housing 20 and the data communication ports 31.

Since EMC is coupled through even very small apertures at high frequencies, and electronics are expected to require clock frequencies on the order of 10-100 gigahertz (GHz), EMC apertures are preferably kept as small as possible. The small size preference for the EMC apertures is new since data rates and operating frequencies of servers have only recently begun to increase into this frequency range. Further, it is preferred that an EMC shielding apparatus be designed to prevent unwanted propagation of electromagnetic noise through the frame or chassis.

Figure 3:
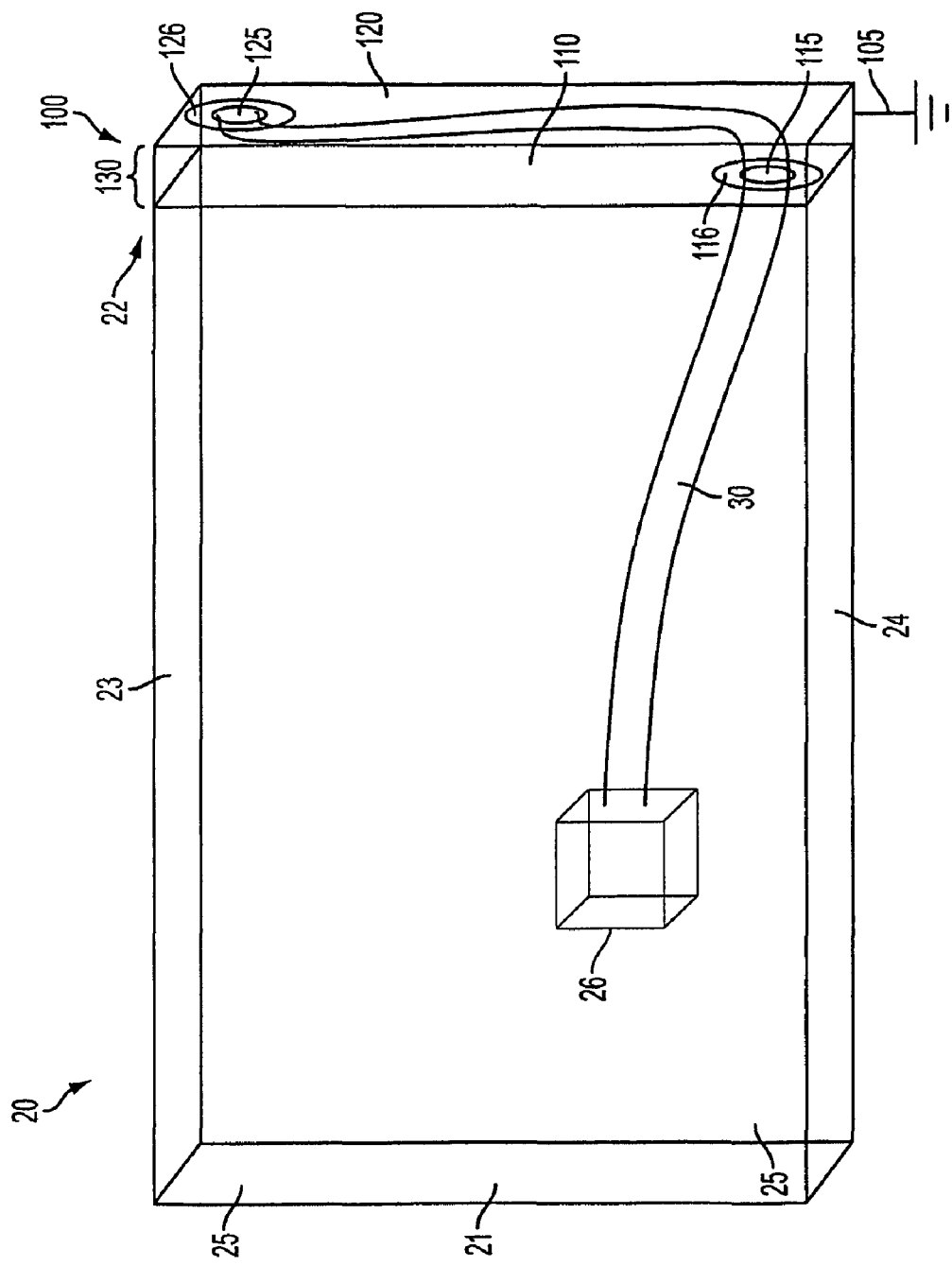
FIG. 3 is a schematic isometric view of an electronic equipment package including a housing with which a shielding apparatus according to embodiments is employed.
Figure 4:
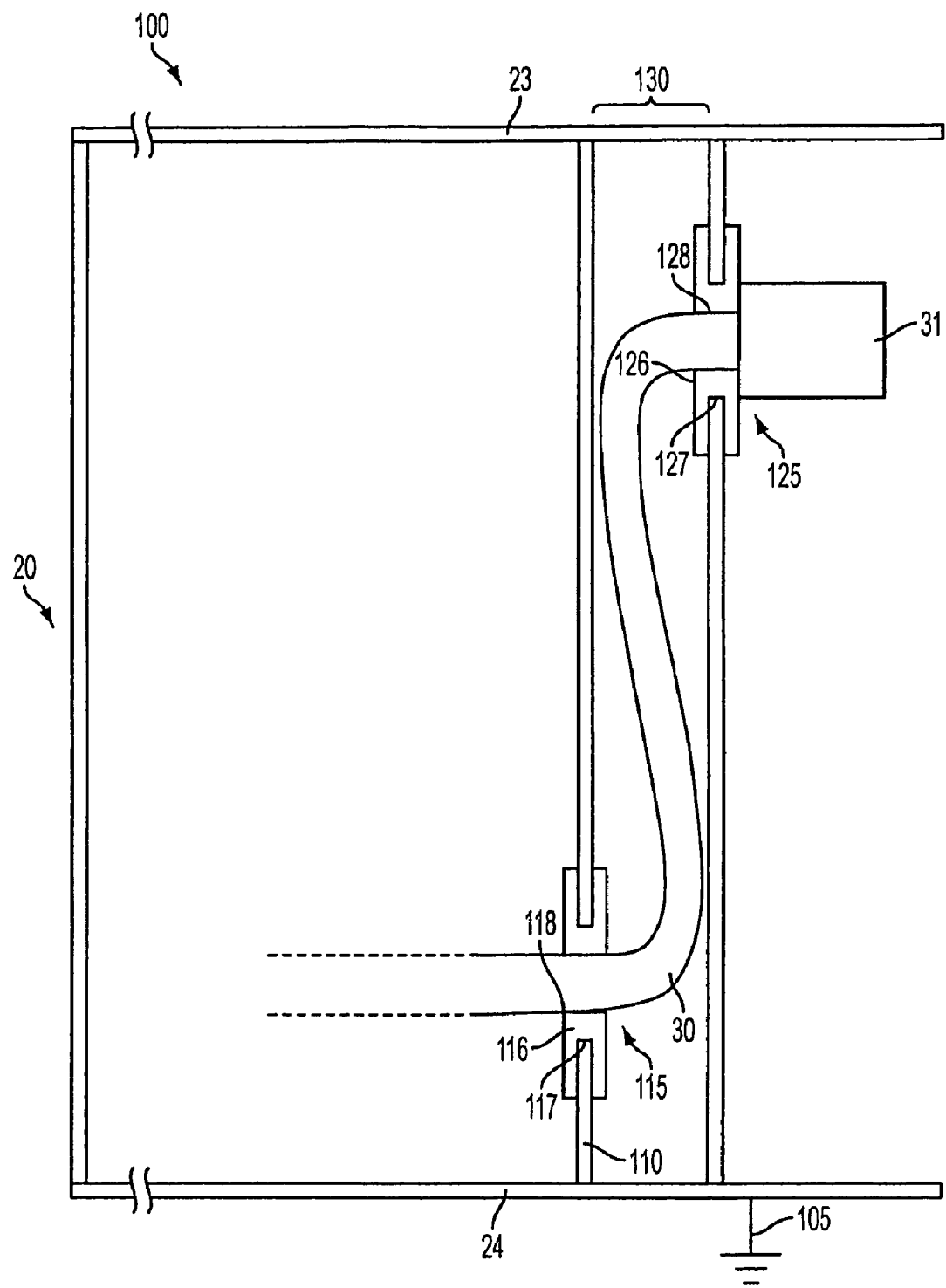
FIG. 4 is a schematic cross sectional side view of a portion of an electronic equipment package including a housing in which a shielding apparatus according to an embodiment such as that shown in FIG. 3 is employed.

According to an embodiment, and with particular reference to FIGS. 3 and 4, cables 30 requiring passage out of the housing 20 are passed through a single access point which may be advantageously located in either the front wall 21 or rear wall 22 of the housing 20, though it is also possible to have the access point located in the top wall 23, bottom wall 24, or a side wall 25 of the housing 20 in embodiments. In the case of optical fiber based cables, the flexibility of optical fibers makes it possible to route hundreds of fibers through an opening only a few centimeters square. The fibers may also be routed long distances within the frame or rack and around other electronic components without causing noise or signal loss, which is a significant advantage over electrical cables.

In an embodiment of the inventive shielding apparatus 100, as seen, for example, in FIGS. 3 and 4, a first electrically conductive sheet 110, such as a first metal shield, is mounted in an end 21, 22 of the housing 20 and includes a first hole 115 through which one or more cables 30, such as optical fibers, are routed. Advantageously, in an embodiment, a first electrically conductive gasket 116 in and/or around the first hole 115 acts to cushion the cables 30 from contact with the edge 117 of the first hole 115. The first electrically conductive gasket 115 also forms a compliant seal between the edge 118 of the first electrically conductive gasket 116 and the cables 30.

Because some EMC radiation may still leak through the first hole 115, either entering or exiting the package, an embodiment includes a second electrically conductive sheet 120, such as a second metal shield, spaced apart from the first electrically conductive sheet 110. The second electrically conductive sheet 120 includes a second hole 125 through which the cables 30 are passed. In an embodiment, a second electrically conductive gasket 126 is mounted in and/or around the second hole 125 to cushion the cables 30 against contact with the edge 127 of the second hole. The edge 128 of the second electrically conductive gasket 126 also forms a compliant seal with the cables 30. The first and second electrically conductive sheets 110, 120 are preferably both in electrical communication with a ground 105, such as a common frame ground, and can also be in electrical communication with each other.

The second electrically conductive sheet 120 is separated from the first electrically conductive sheet 110 by a gap 130. Advantageously, the first and second electrically conductive sheets 110, 120 in an embodiment are substantially parallel. The gap 130 between the first and second electrically conductive sheets 110, 120 is sized to avoid the gap 130 acting as a waveguide for EMC radiation. That is, the rectangular cross section formed by the gap 130 and the width of the first and second electrically conductive sheets 110, 120 forms a waveguide whose cutoff propagation frequency is a predefined or desired cutoff frequency whose value is lower than the frequency of the EMC radiation which is to be blocked from entering or exiting the housing 10, yet is preferably still small enough to keep the size of the overall package compact. The dimensions can be determined using the formula:

$$F_{cutoff_{des}} = \frac{c}{4h_{gap}} \text{ or }$$

$$h_{gap} = \frac{c}{4F_{cutoff_{des}}}$$

where c is the speed of light in centimeters per nanosecond (30 cm/ns) and $F_{cutoff_{des}}$ is expressed in gigahertz (GHz), yielding the size of the gap $h_{gap}$ in centimeters (cm). Note that the wavelength of the desired cutoff frequency is about four times the size of the gap. Preferably, the width of the first and second electrically conductive sheets 110, 120 is less than or equal to twice the size of the gap. In other words, the width should be no larger than half the wavelength of the predefined desired cutoff frequency. Thus, the width of the first and second electrically conductive sheets 110, 120 can be determined by doubling the size of the gap. Additionally, to prevent propagation, the length or height of the shielding apparatus 100, depending on the orientation of the apparatus, should be at least a wavelength of the radiation at the desired cutoff frequency. The wavelength is four times the size of the gap, so the electromagnetic shielding apparatus should have a length or height at least four times the size of the gap.

For example, a rectangular metal waveguide formed by a gap of 50 millimeters (mm) or less between first and second electrically conductive sheets 100 mm wide would have a cutoff propagation frequency of about 1.5 GHz. For such a gap, radiation at 10 GHz would be attenuated at a rate of about 0.12 decibels per meter (dB/m). For comparison, a gap of 5 mm between sheets 10 mm wide would have a cutoff frequency of about 15 GHz. Such an arrangement would attenuate 10 GHz radiation at about 2000 dB/m, so a 50 mm-long path through such a structure would attenuate EMC radiation at this frequency by about 100 dB, with more attenuation at lower frequencies.

An additional factor in gap sizing is that the cables have a minimum bend radius below which they can suffer damage. Typically, cables have a minimum bend radius of, for example, from about 2 to about 3 centimeters (cm), although some can have minimum bend radius of less than about 0.5 cm. Thus, the cables 30 in an embodiment are routed between the first and second electrically conductive sheets 110, 120 in a serpentine fashion to provide mechanical strain relief. A collection of optical cables is small in area and can be routed through a small hole in the metallic package. They can then be routed through the gap out to the fan out to actual connectors that are much larger.

Figure 5:
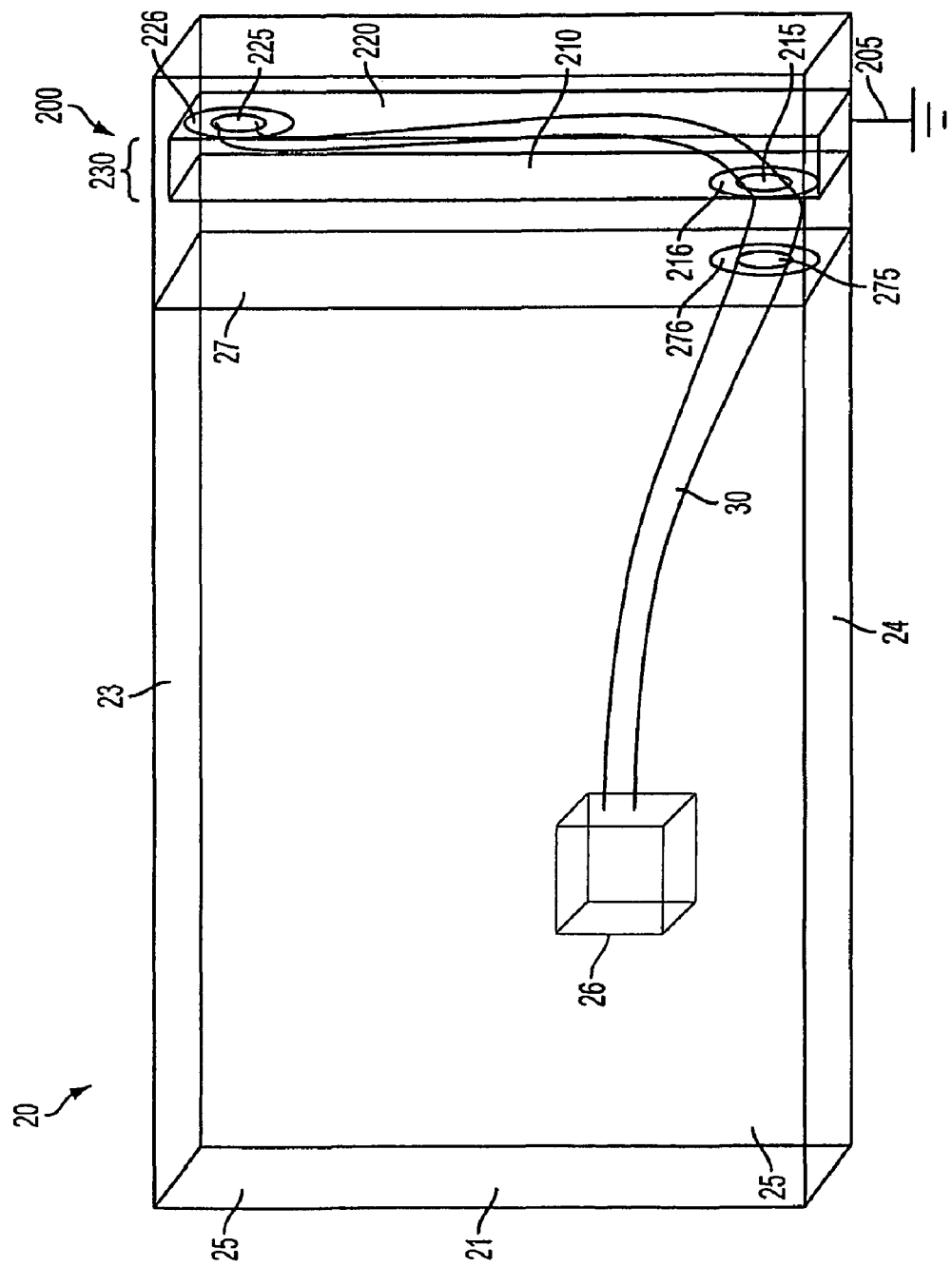
FIG. 5 is a schematic isometric view of an electronic equipment package including a housing with which a shielding apparatus according to embodiments is employed.
Figure 6:
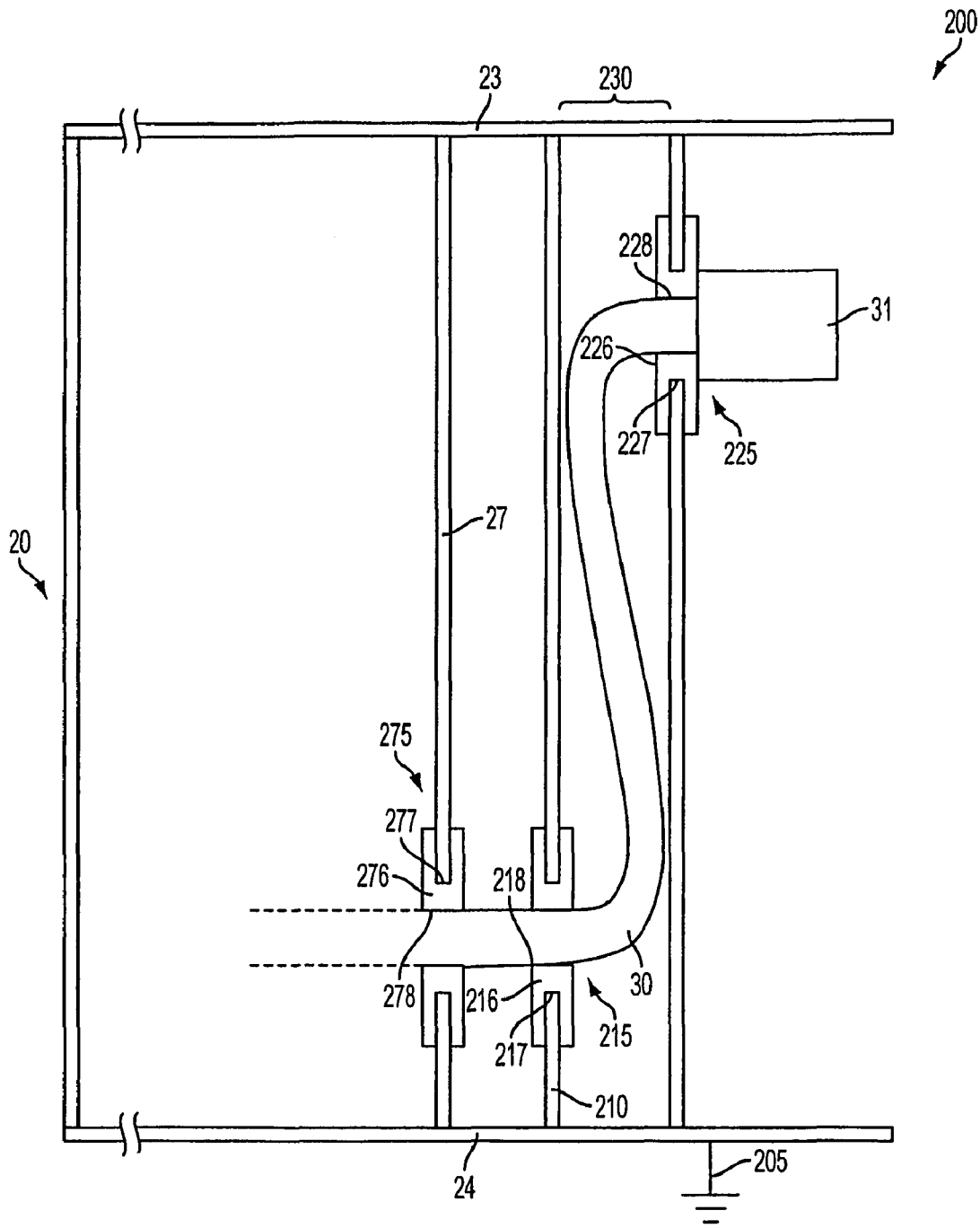
FIG. 6 is a schematic cross sectional side view of a portion of an electronic equipment package including a housing in which a shielding apparatus according to an embodiment such as that shown in FIG. 5 is employed.

While the first and second electrically conductive sheets 110, 120 are shown as extending across the entire width of the housing, they need not do so, as seen, for example, in the embodiment illustrated in FIGS. 5 and 6. In such an embodiment, the housing 20 includes a rear wall 27 at the rear end 22. As in the embodiment of FIGS. 3 and 4, the embodiment 200 illustrated in FIGS. 5 and 6 includes first and second electrically conductive sheets 210, 220 with respective first and second apertures 215, 226 and separated by a gap 230. Preferably, as above, the first and second electrically conductive gaskets 216, 226 are mounted in the first and second holes 215, 225 to cushion the cables 30 against engagement with the edges 217, 227 of the first and second holes 215, 225, the inner edges 218, 228 of the first and second electrically conductive gaskets 216, 226 engaging the cables 30. However, the first and second electrically conductive sheets 210, 220 extend only part way across the housing 20 to a side wall 240 that completes the shielding. The rear wall 27 includes a third hole 275 through which the cables 30 can pass. A third electrically conductive gasket 276 is preferably mounted in the third hole 275 to cushion the cables 30 against engagement with the edge 277 of the third hole 275, the inner edge 278 of the third electrically conductive gasket 276 engaging the cables 30. At least the first and second electrically conductive sheets 210, 220 are in electrical communication with the ground 205.

Figure 7:
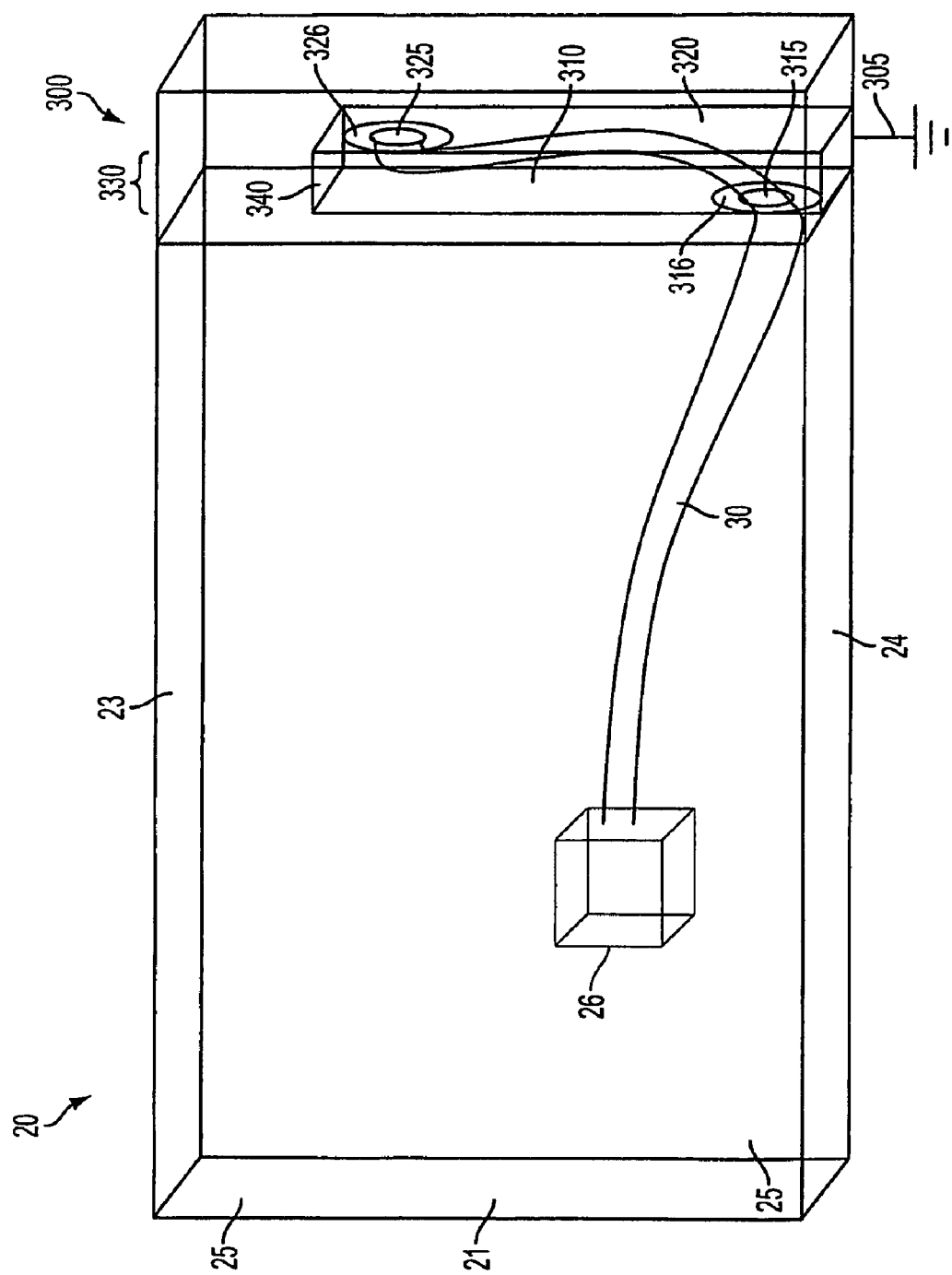
FIG. 7 is a schematic isometric view of an electronic equipment package including a housing with which a shielding apparatus according to embodiments is employed.
Figure 8:
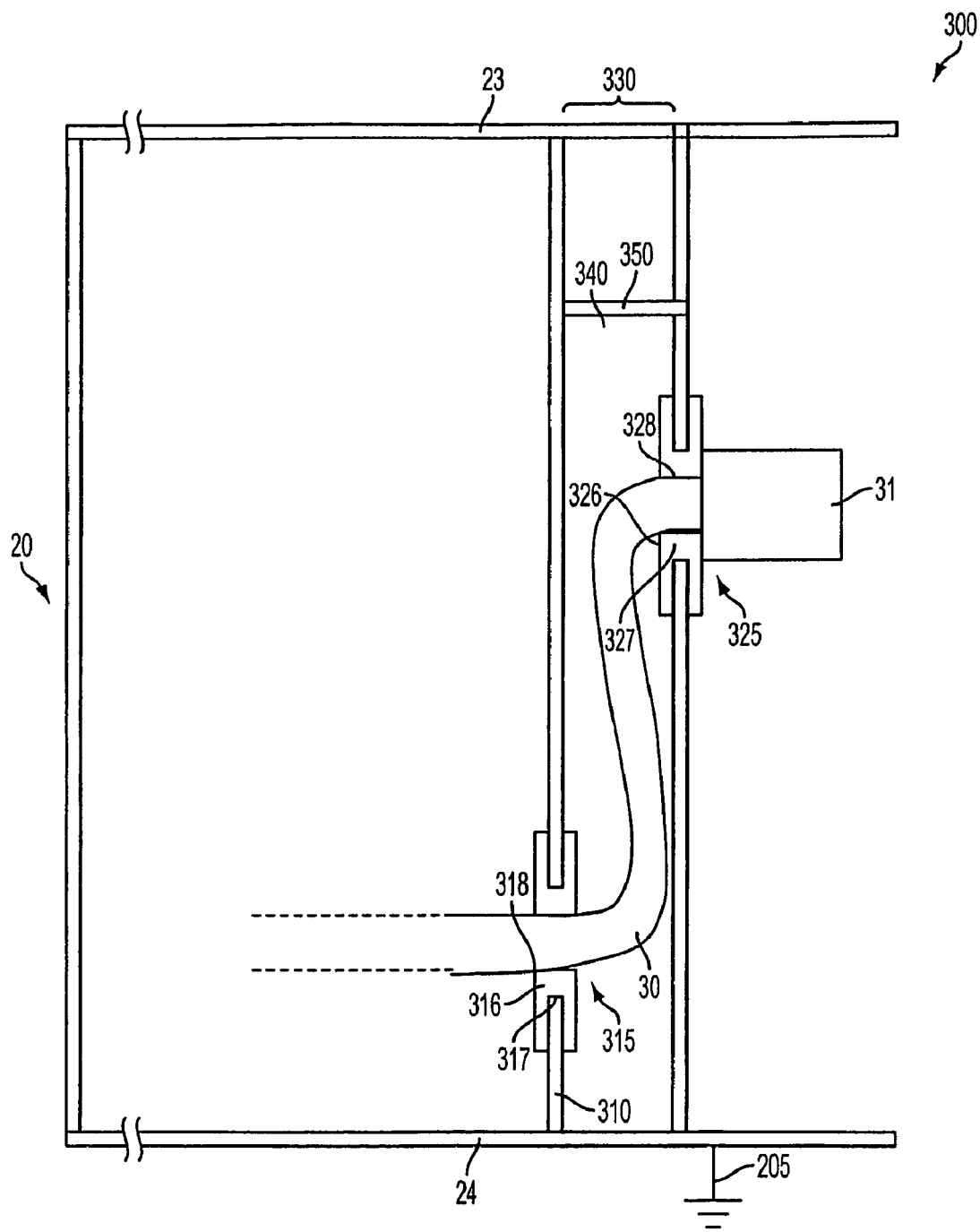
FIG. 8 is a schematic cross sectional side view of a portion of an electronic equipment package including a housing in which a shielding apparatus according to an embodiment such as that shown in FIG. 7 is employed.

As seen in FIGS. 7 and 8, embodiments need not have the sheets extend along the entire height of the housing 20. In the additional example embodiment of FIGS. 7 and 8, the shielding apparatus 300 includes first and second electrically conductive sheets 310, 320 separated by a gap 330, extending part way across the housing 20 to meet a side wall 340, and having respective first and second apertures 315, 325 through which the cables 30 can pass. As above, the first and second holes 315, 325 preferably include respective first and second electrically conductive gaskets 316, 326 to cushion the cables 30 against engagement with the edges 317, 327 of the first and second holes 315, 325, the inner edges 318, 328 of the first and second electrically conductive gaskets 316, 326 engaging the cables 30. However, the first and second electrically conductive sheets 210, 220 extend only part way along the height of the housing 20 to a top wall 350 that completes the shielding. At least the first and second electrically conductive sheets 310, 320 are in electrical communication with the ground 305.

While the embodiments discussed above show the holes for cable passage in the first and second electrically conductive sheets, one or both of the holes can instead be formed in a single one of the electrically conductive sheets, in one or both of the side walls, or in one or both end walls. For example, in the embodiment shown in FIGS. 7 and 8, the second hole 325 could be formed in the side wall 340, the side wall of the housing 25, the bottom wall 24 of the housing, or the end wall 350 of the shielding apparatus. Since the orientation of the shielding apparatus is not important, if the shielding apparatus is in an orientation that allows, the holes can be formed in ends of the rectangular conduit formed by the first and second electrically conductive sheets and the side walls.

Figure 9:
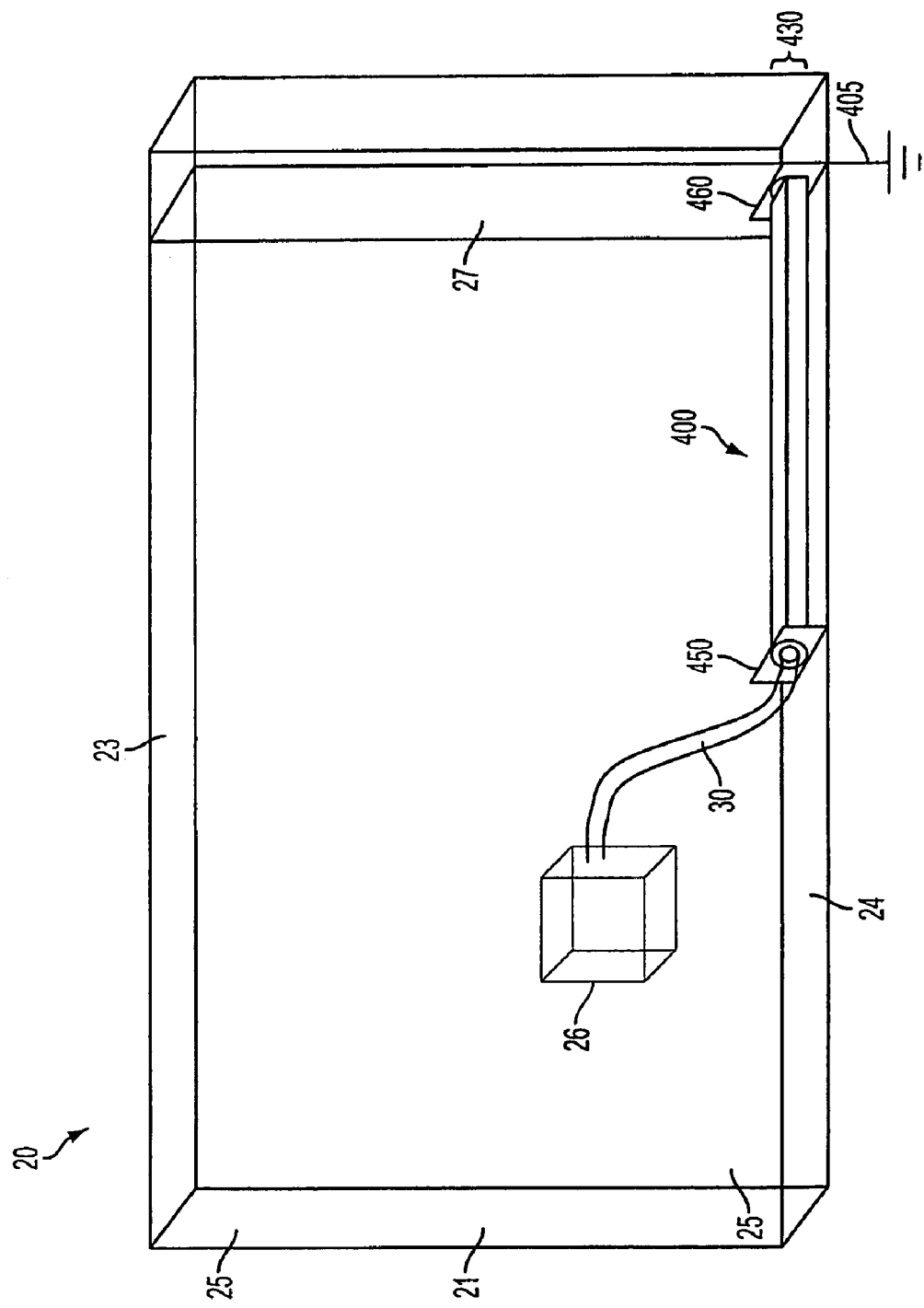
FIG. 9 is a schematic isometric view of an electronic equipment package including a housing with which a shielding apparatus according to embodiments is employed.
Figure 10:
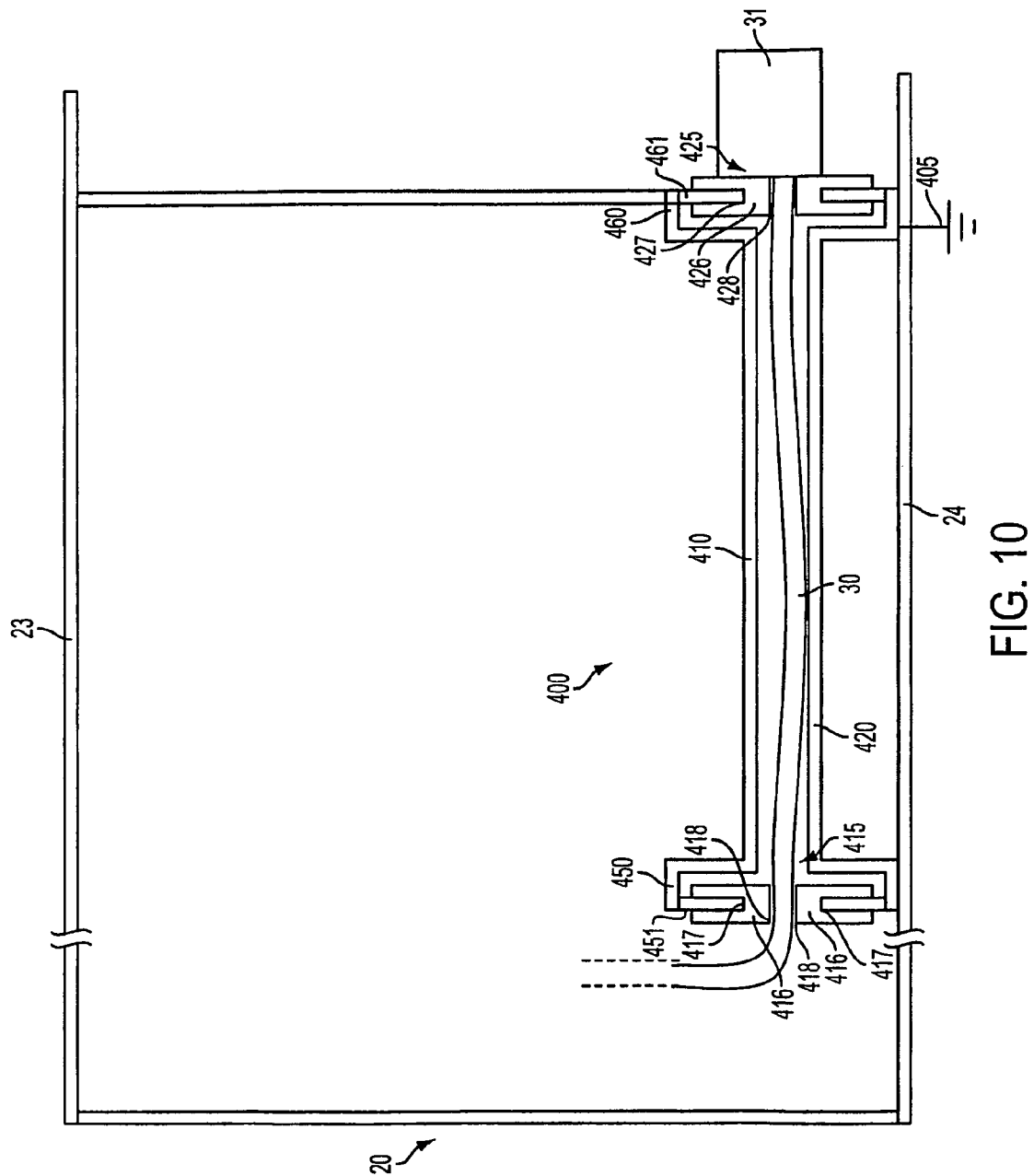
FIG. 10 is a schematic cross sectional side view of a portion of an electronic equipment package including a housing in which a shielding apparatus according to an embodiment such as that shown in FIG. 9 is employed.
Figure 11:
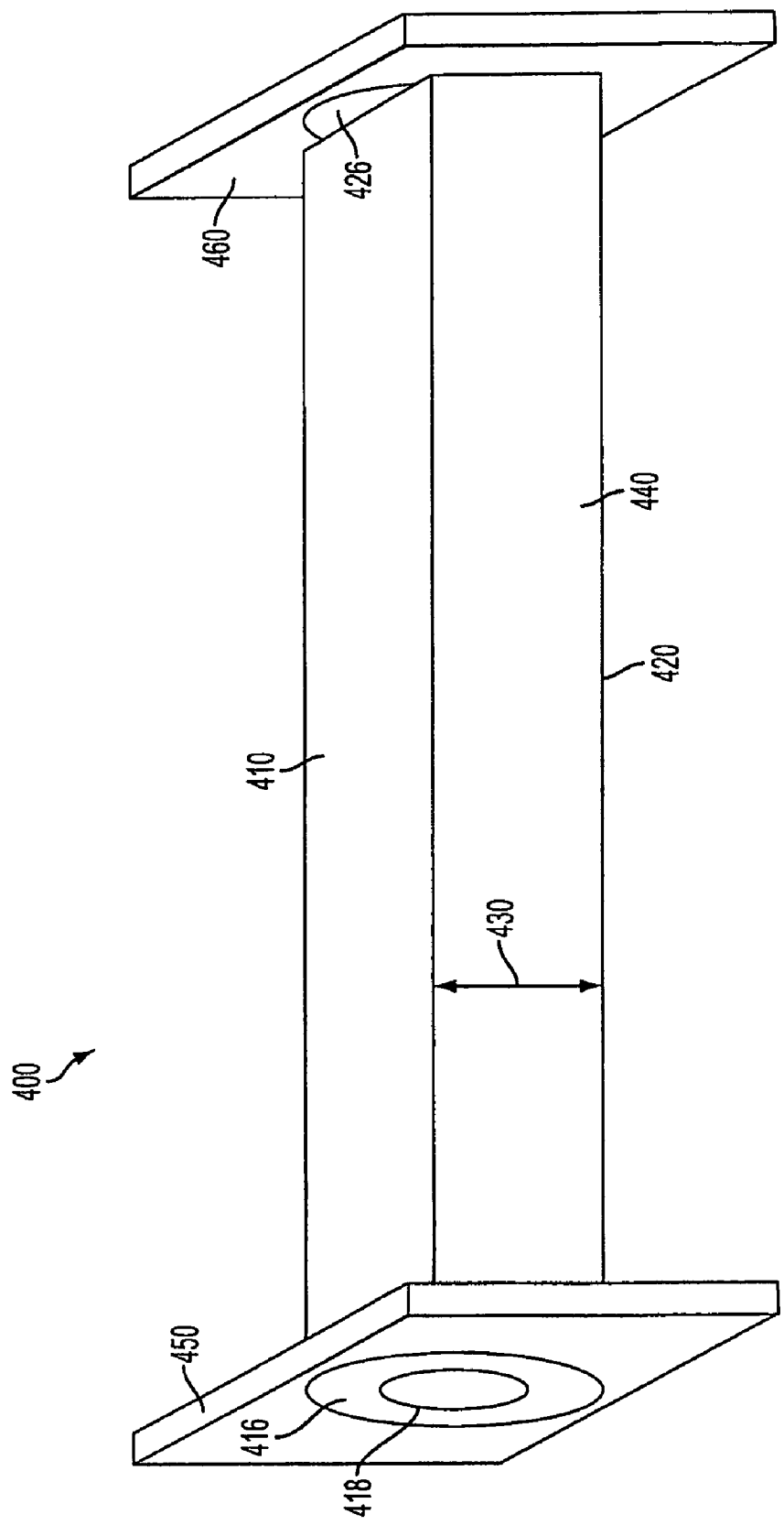
FIG. 11 is a schematic isometric view of a shielding apparatus according to embodiments such as that shown in FIGS. 9 and 10 is employed.

An example of such a differently oriented shielding apparatus is the further embodiment of a shielding apparatus 400 is shown in FIGS. 9-11. The first and second sheets 410, 420 are opposed walls separated by the gap 430 and extend between opposed side walls 440 to form a rectangular conduit. As discussed above, the first and second electrically conductive sheets 410, 420 preferably have a width that is twice the size of the gap and a length that is less than four times the size of the gap. First and second supports 450, 460 at the ends of the first and second sheets 410, 420 and side walls 440 include first and second end plates 451, 461 including respective first and second holes 415, 425 through which the cables 30 can pass. As above, first and second electrically conductive gaskets 416, 426 are preferably mounted in respective first and second holes 415, 425 to cushion the cables 30 against the edges 417, 427 of the first and second holes 415, 425, the inner edges 418, 428 of the first and second electrically conductive gaskets 416, 426 engaging the cables 30. The first and second electrically conductive sheets 410, 420 are in electrical communication with the ground 405.

In each of the embodiments illustrated above, it should be understood that the shielding apparatus can have any orientation and that the sheets need not form a straight gap, but can describe a curved gap so long as the gap itself retains a substantially rectangular cross section with the dimensions discussed above.

Optical connectors do not need to have electrical or metallic contacts and grounds as do electrical connectors and cables, which presents an obstacle to EMC shielding since the grounds of connectors are generally used to reduce emissions. On the other hand, because there is usually little or no metal in an optical connector, the optical connector does not contribute radiation. Since the radiation within optical cables is coming from a transformation of electrical signaling to optical signaling that occurs in electro-optical components within the housing, radiation can be intercepted within the housing where the optical cables are small and allows the actual optical connectors to be outside of the shielding.

Employing a shield apparatus according to an embodiment can provide the advantage of sizing the gap between the first and second electrically conductive sheets to provide arbitrary frequency cutoffs for radiation to be blocked. An additional advantage of a shielding apparatus according to an embodiment is that cables routed through the gap are provided strain relief. Further, particularly with respect to optical cables, since the shielding apparatus of an embodiment can be inside the housing prior to the connectors to which the cables are to be attached, the overall package size does not to be increased, and the shielding apparatus does not interfere with optical connector design.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A shielding apparatus comprising:
   first and second electrically conductive sheets attached to an interior of a housing in spaced apart, substantially parallel relationship, both the first and second electrically conductive sheets being in electrical communication with a ground;
   a gap between the first and second electrically conductive sheets;
   each of the first and second electrically conductive sheets having a width no more than twice that of a size of the gap and length at least four times the size of the gap, the gap thereby being sized to prevent propagation of electromagnetic radiation above a predefined wavelength.

2. The shielding apparatus of claim 1 further comprising a first hole in one of the first electrically conductive sheet, the second electrically conductive sheet, a side wall, and an end wall of the shielding apparatus.

3. The shielding apparatus of claim 2 a second hole in one of the first electrically conductive sheet, the second electrically conductive sheet, a side wall, and an end wall of the shielding apparatus.

4. The shielding apparatus of claim 3 further comprising an electrically conductive gasket in one of the first and second holes.

5. The shielding apparatus of claim 3 further comprising first and second electrically conductive gaskets in respective ones of the first and second holes.

6. The shielding apparatus of claim 1 wherein the gap is sized to prevent cables extending through the first and second holes from adopting a radius of curvature below a predefined value.

7. The shielding apparatus of claim 1 wherein one of the first and second electrically conductive sheets is a back wall of the housing.

8. The shielding apparatus of claim 1 wherein one of the first and second electrically conductive sheets is mounted on an interior of a back wall of the housing.

9. A shielding apparatus comprising:
   a first electrically conductive sheet configured to be attached to a housing, the housing containing an object to be shielded;
   a second electrically conductive sheet configured to be attached to the housing and in electrical communication with a ground, the second sheet being substantially parallel to the first electrically conductive sheet;
   at least one of the first and second electrically conductive sheets being connected to a ground;
   a gap between the first and second electrically conductive sheets and sized to accommodate cables passing into the housing and connected to the object to be shielded;
   a first hole sized to accommodate cables passing into the housing and connected to the object to be shielded, the first hole being formed in one of the first electrically conductive sheet, the second electrically conductive sheet, a side wall of the shielding apparatus, and an end wall of the shielding apparatus; and
   a second hole sized to accommodate cables passing into the housing and connected to the object to be shielded, the second hole being formed in one of the first electrically conductive sheet, the second electrically conductive sheet, a side wall of the shielding apparatus, and an end wall of the shielding apparatus;
   a size of the gap being sized based on a predetermined frequency of radiation to be blocked by the shielding apparatus, the first and second electrically conductive sheets having a width that is no more than twice the size of the gap, the first and second electrically conductive sheets further having a length that is at least four times the size of the gap.

10. The shielding apparatus of claim 9 further comprising at least one electrically conductive gasket in a respective one of the first and second holes.

11. The shielding apparatus of claim 10 wherein the at least one electrically conductive gasket comprises one electrically conductive gasket in one of the first and second holes.

12. The shielding apparatus of claim 10 wherein the at least one electrically conductive gasket is sized to engage the cables.

13. The shielding apparatus of claim 9 wherein at least one of the first electrically conductive sheet, the second electrically conductive sheet, a side wall of the shielding apparatus, and an end wall of the shielding apparatus is a wall of the housing.

14. The shielding apparatus of claim 9 wherein at least one of the first electrically conductive sheet, the second electrically conductive sheet, a side wall of the shielding apparatus, and an end wall of the shielding apparatus is mounted on an interior of a wall of the housing.

15. A method of shielding against electromagnetic radiation comprising:
   forming a first hole in one of a first electrically conductive sheet, a second electrically conductive sheet, a side wall of a shielding apparatus, and an end wall of the shielding apparatus;
   forming a second hole in one of the first electrically conductive sheet, the second electrically conductive sheet, a side wall of a shielding apparatus, and an end wall of the shielding apparatus, the second hole being of substantially identical dimension to the first electrically conductive sheet; and
   orienting the first and second electrically conductive sheets in substantially parallel relationship separated by a gap of a size based on a predetermined cutoff frequency of radiation to be blocked and such that the first and second electrically conductive sheets have a width that is no more than twice the size of the gap.

16. The method of claim 15 further comprising placing a respective first and second electrically conductive gasket in each of the first and second holes.

17. The method of claim 15 further comprising mounting the first and second electrically conductive sheets in a housing and placing the first and second electrically conductive sheets in electrical communication with a ground.

* * * * *